(12) United States Patent
Kamiya

(10) Patent No.: US 6,492,667 B2
(45) Date of Patent: *Dec. 10, 2002

(54) RADIO FREQUENCY SEMICONDUCTOR APPARATUS

(75) Inventor: Shinji Kamiya, Kyoto (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/552,309

(22) Filed: Apr. 19, 2000

(65) Prior Publication Data

US 2002/0163018 A1 Nov. 7, 2002

(30) Foreign Application Priority Data

Apr. 23, 1999 (JP) .............................. 11-117336
Mar. 22, 2000 (JP) ........................ 2000-081062

(51) Int. Cl.⁷ .............................................. H01L 27/10
(52) U.S. Cl. ....................... 257/208; 257/207; 257/691; 257/692
(58) Field of Search ................................. 257/207, 208, 257/503, 692, 691, 784, 786

(56) References Cited

U.S. PATENT DOCUMENTS 4,686,492 A    8/1987  Grellmann et al. ........... 29/829
5,606,196 A    2/1997  Lee et al. .................... 257/503
5,677,570 A  * 10/1997  Kondoh et al. ............. 257/690
6,208,023 B1 * 3/2001  Nakayama et al. ......... 257/696

FOREIGN PATENT DOCUMENTS

JP    2-107001          4/1990
JP    02-226748     *   9/1990
JP    3-262302         11/1991

OTHER PUBLICATIONS

Turinsky, "Chiptraeeger Fuer Hochgeschwindigkeits–is", Radio Fernsehen Elektronik, DE, VEB VERLAG TECHNIK, Berlin, vol. 41, No. 1, 1992, pp. 25–26.

Lee, "Wideband Characterization of Mutual Coupling Between High Density Bonding Wires", IEEE Microwave and Guided Wave Letters, U.S., IEEE Inc., New York, vol. 4, No. 8, Aug. 1, 1994, pp. 265–267.

* cited by examiner

*Primary Examiner*—Phat X. Cao
(74) *Attorney, Agent, or Firm*—Nixon & Vanderhye PC

(57) ABSTRACT

According to one aspect of the present invention, there is provided a radio frequency (RF) semiconductor apparatus including a RF semiconductor circuit chip; a substrate on which the RF semiconductor circuit chip is mounted; and a signal line and a corresponding ground line for connecting the RF semiconductor circuit chip to the substrate. In this apparatus, the signal line and the ground line are arranged in such positions that a magnetic field created by the signal line and a magnetic field created by the ground line substantially cancel each other.

10 Claims, 7 Drawing Sheets

Relationship between number of wires in parallel connection and equivalent inductance value Relationship between number of grounding wires and gain of amplification circuit Relationship between wire interval (between signal line and ground line) and equivalent inductance value Relationship between wire interval (between signal line and ground line) and gain of amplification circuit Difference in equivalent inductance value according to different wire arrangements Difference in MAG of amplification circuit according to different wire arrangements

RADIO FREQUENCY SEMICONDUCTOR APPARATUS

BACKGROUND OF THE INVENTION

1. Field of the Invention

The present invention relates to a radio frequency (RF) semiconductor apparatus, and more particularly, to an electrical connection structure for achieving excellent radio frequency characteristics in a radio frequency semiconductor apparatus which operates in the gigahertz (GHz) band.

2. Description of the Related Art

In recent years, the need for integrated circuits operating in the microwave or millimeter wave band has increased as a result of the widespread use of mobile communications means such as PHS (Personal Handy Phone System) and PDC (Personal Digital Cellular phone).

As a result, the development of Si or GaAs transistors has advanced enough to produce highly-integrated MMICs (Monolithic Microwave Integrated Circuits) incorporating such transistors, e.g., power amplifiers, mixers, and low-noise amplifiers.

In such an integrated circuit operating in a radio frequency band, more than negligible parasitic inductance may exist which significantly affects the characteristics of the integrated circuit.

For example, when a RF semiconductor circuit chip is mounted in a package or on a substrate, bonding wires used for electrical connection purposes tend to have a substantial inductance component. In order to obtain the expected circuit performance of the RF semiconductor circuit chip, it is important to minimize such inductance components.

While it is possible to reduce the inductance component residing in a signal line extended from a RF semiconductor circuit chip through impedance matching with an externally-connected load circuit, the inductance component residing in a ground line cannot be controlled through such impedance matching.

Thus, in the case of mounting a RF semiconductor circuit chip composed of, e.g., gallium arsenide (GaAs), it is essential to connect the ground line to a grounding surface in such a manner that the inductance associated with the ground line within the chip is minimized. Otherwise, the above-mentioned inductance tends to reduce the gain of any amplification circuit within the chip, particularly in a RF band.

Conventional methods for reducing the above-mentioned inductance fall into two major categories. One category is employed in the case, for example, where a GaAs integrated circuit chip is mounted on a package and electrically connected by wire bonding. These methods amount to increasing as much as possible the number of bonding wires which extend from bonding pads within the chip to be each connected to either a lead frame or a slug which is located immediately below the chip. In other words, a plurality of bonding wires each having a certain inductance value are arranged in parallel connection so as to reduce the total inductance of the bonding wires.

FIG. 3 is a schematic diagram illustrating the above-described method of arranging bonding wires in such a parallel connection. This example illustrates wire bonding for an output stage of an amplifier circuit within a multi-transistor unit.

In FIG. 3, 1 denotes an IC chip; 2 denotes an output stage transistor within the chip; 3 denotes a bonding pad on the chip; 4 denotes a signal line (bonding wire); 5 denotes a ground line (bonding wire); 7 denotes a signal lead frame pin; 8 denotes a grounding point; and 9 denotes a substrate. The grounding point 8 is typically a metal portion (usually referred to as "slug") exposed on a back face of a package; otherwise a grounding lead frame pin may be used.

In the example shown in FIG. 3, four bonding wires are used as the ground lines 5 for grounding emitters of the output stage transistor 2 within the IC chip 1.

The other category for reducing the inductance of a bonding wire involves reducing the length of the bonding wires. According to the methods in this category, a portion on a chip to be die-bonded is arranged so as to be lower than the other portions of the chip. In this manner, the height of the bonding pads on the chip is matched to that of the patterned circuitry on the surface of the substrate. As a result, the length of the bonding wires is shortened, thereby reducing the inductance values of the bonding wires. Such methods are disclosed in Japanese Laid-open Publication No. 2-107001 and Japanese Laid-open Publication No. 3-262302, for example.

Another method to shorten the length of a lead wire is to make a very small hole into a GaAs integrated circuit chip so that a ground line within the chip can be connected to a ground surface on the back face of the chip through this hole.

However, the aforementioned conventional methods for minimizing inductance components have the following problems.

A plurality of grounding bonding wires may be arranged in parallel in an attempt to reduce the inductance in the ground lines. However, as the number of bonding wires increases, the chip size will become larger due to the space required for the wires if the intervals between the bonding wires remain unchanged. In other words, in order to prevent a decrease in the packing density on the chip, the intervals between the bonding wires should be made narrow. However, narrower intervals between the bonding wires causes electromagnetic coupling between adjacent bonding wires, thereby resulting in an increased mutual inductance between the wires. Therefore, simply introducing an increased number of bonding wires may not necessarily reduce the total inductance as desired.

The above problem is illustrated in FIG. 4, which is a graph illustrating the relationship between the number of bonding wires (length: about 1 mm) which are arranged in parallel at an interval of about 140 $\mu$m and the equivalent inductance value thereof as estimated by an electromagnetic field simulation. Illustrated for comparison are the inductance values obtained by dividing the simulated result for one wire by different numbers of wires.

The simulation was conducted under the conditions of an operating frequency of about 2 GHz and a signal line impedance of about 2Ω (assuming an output stage transistor for a power amplifier).

As shown in FIG. 4, the equivalent inductance value of the bonding wires does not decrease in exact inverse proportion to the number of wires (as would be expected absent the effects of mutual inductance). Rather, the equivalent inductance value remains higher than the expected value. This is presumably caused by a so-called mutual inductance phenomenon, in which the in-phase magnetic fields occurring around the wires affect adjacent wires so as to prevent currents from passing therethrough.

In the simulation in FIG. 4, the interval between the bonding wires was kept constant at about 140 $\mu$m regardless of the number of wires. As previously described, the mutual inductance increases as the interval between the bonding wires decreases. Therefore, it will be understood that the equivalent inductance-reducing effect associated with an increase in the number of wires is attenuated as the interval between the bonding wires decreases, because of increased mutual inductance.

FIG. 5 is a graph illustrating a MAG (Maximum Available Gain: a maximum gain obtained through complete input/output impedance matching) of an amplification circuit incorporating an output stage transistor, where the results of the graph in FIG. 4 are applied to a ground line 5 extending from the emitter of the output stage transistor. This simulation was conducted in order to determine MAG values at an operating frequency of about 2 GHz.

As shown in FIGS. 4 and 5, the equivalent inductance of bonding wires can be reduced as the number of wires is increased, thereby making it possible to obtain a large gain in an amplification circuit incorporating such bonding wires. However, an increased number of wires would result in a larger chip size due to a corresponding increase in the number of bonding pads on the chip, as mentioned before, thereby resulting in higher manufacturing costs.

On the other hand, decreasing the interval between the bonding wires to avoid an increase in the chip size will not make for much increase in the gain of the amplification circuit because an increased mutual inductance will occur between adjacent wires, as already discussed above.

As for the method of reducing the length of the bonding wire to minimize the inductance of wires, there is a problem in that it is necessary to make a recess portion on a substrate where a chip is die-bonded. This adds to the manufacturing cost. Furthermore, there exists a limit as to how short a wire may be used, such limit being dictated by the wire bonding machine used to provide wire bonding. Thus, it is difficult to employ wire lengths which are any shorter than currently available.

Moreover, the method of making a grounding hole in a chip complicates the manufacturing process, leading to higher costs.

SUMMARY OF THE INVENTION

According to one aspect of the present invention, there is provided a radio frequency (RF) semiconductor apparatus including a RF semiconductor circuit chip; a substrate on which the RF semiconductor circuit chip is mounted; and a signal line and a corresponding ground line for connecting the RF semiconductor circuit chip to the substrate. In this apparatus, the signal line and the ground line are arranged in such positions that a magnetic field created by the signal line and a magnetic field created by the ground line substantially cancel each other.

In one embodiment of the present invention, the signal line and the ground line are arranged adjacent to each other.

In another embodiment of the present invention, the signal line and the ground line are arranged substantially in parallel to each other.

In still another embodiment of the present invention, the signal line and the ground line are arranged with an interval of about 60 $\mu$m between respective conductor centers of the signal line and the ground line.

In still another embodiment of the present invention, the signal line and the ground line each have a length of about 1 mm and a diameter of about 25 $\mu$m.

In still another embodiment of the present invention, the signal line and the ground line comprise gold (Au).

In still another embodiment of the present invention, the RF semiconductor circuit chip comprises gallium arsenide (GaAs).

In still another embodiment of the present invention, the RF semiconductor circuit chip, the signal line and the ground line are placed within a package.

In still another embodiment of the present invention, the package comprises a sealing resin.

According to another aspect of the present invention, there is provided a radio frequency (RF) semiconductor apparatus including a RF semiconductor circuit chip; a substrate on which the RF semiconductor circuit chip is mounted; and a plurality of pairs of signal lines and ground lines, each pair comprising a signal line and a corresponding ground line, for connecting the RF semiconductor circuit chip to the substrate. In this apparatus, the signal line and the ground line are arranged in such positions that a magnetic field created by the signal line and a magnetic field created by the ground line substantially cancel each other in each of the plurality of pairs.

In one embodiment of the present invention, the signal line and the ground line are arranged adjacent to each other.

In another embodiment of the present invention, the signal line and the ground line are arranged substantially in parallel to each other.

In still another embodiment of the present invention, the signal line and the ground line are arranged with an interval of about 140 $\mu$m between respective conductor centers of the signal line and the ground line.

In still another embodiment of the present invention, the signal line and the ground line each have a length of about 1 mm and a diameter of about 25 $\mu$m.

In still another embodiment of the present invention, the signal line and the ground line comprise gold (Au).

In still another embodiment of the present invention, the RF semiconductor circuit chip comprises gallium arsenide (GaAs).

In still another embodiment of the present invention, the plurality of pairs are positioned adjacent to each other.

In still another embodiment of the present invention, the plurality of pairs are positioned adjacent to each other, and the signal line and the ground line are arranged so as to alternate throughout the plurality of pairs.

In still another embodiment of the present invention, the RF semiconductor circuit chip, the signal line and the ground line are placed within a package.

In still another embodiment of the present invention, the package comprises a sealing resin.

According to the present invention, a ground line and a signal line, having a phase difference of about 180° from each other, are arranged in parallel and adjacent to each other (and/or disposed in an alternating arrangement) so as to advantageously utilize the mutual inductance between the signal line and the ground line. As a result, the present invention effectively reduces the equivalent inductance value of any ground lines in a RF semiconductor circuit.

Thus, the invention described herein makes possible the advantage of providing a RF semiconductor apparatus incorporating a radio frequency(RF) semiconductor circuit chip such that the performance of the RF semiconductor circuit chip can be exhibited to its full capacity. This can be achieved by means of a specific arrangement of a ground line and a corresponding signal line extending from the chip for reducing the inductance of the ground line, such that those lines are arranged adjacent to each other so as to minimize the mutual inductance thereof.

This and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
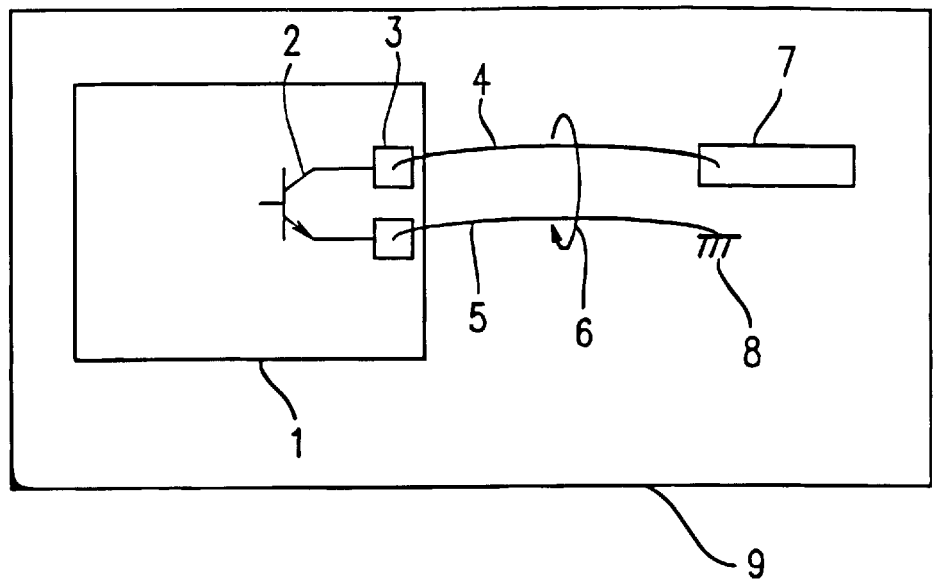
FIG. 1 is a schematic diagram illustrating a radio frequency (RF) semiconductor apparatus according to Example 1 of the present invention.

FIG. 1 is a schematic diagram illustrating a radio frequency semiconductor device according to Example 1 of the present invention.

In FIG. 1, reference numeral 1 denotes an IC chip (e.g., GaAs); 2 denotes an output stage transistor in the IC chip; 3 denotes a bonding pad; 4 denotes a signal line (bonding wire); 5 denotes a ground line (bonding wire); 7 denotes a lead frame pin for the signal line; 8 denotes a grounding point; and 9 denotes a substrate. The direction of the electromagnetic coupling between the signal line 4 and the ground line 5 is indicated by arrow 6. As previously described in the BACKGROUND OF THE INVENTION, the grounding point 8 is typically a metal portion (usually referred to as "slug") exposed on a back face of a package. Alternatively, a grounding lead frame pin may be used for the grounding point 8.

For conciseness, only the output stage transistor 2 is illustrated for discussion, while omitting other elements of the radio frequency semiconductor device.

The output stage transistor 2 within the chip includes a collector (or a drain) and an emitter (or a source). The lead wires for the collector and the emitter serve as a signal line 4 and a ground line 5, respectively. The respective currents in the signal line 4 and the ground line 5 usually have a phase difference of about 180°.

The bonding wires (i.e., the signal line 4 and the ground line 5) are arranged in parallel and adjacent to each other, so that the magnetic fields created by the respective bonding wires 4 and 5 reduce or substantially cancel each other.

Thus, the bonding wires (i.e., the signal line 4 and the ground line 5), which extend from the bonding pads 3 within the IC chip 1, are arranged in parallel and as adjacent to each other as possible so that these bonding wires can be electromagnetically coupled. As a result, the equivalent inductance value of the bonding wires 4 and 5 can be reduced due to mutual inductance generated by the inverted current phases within the bonding wires 4 and 5.

As used herein, the bonding wires 4 and 5 being in a "parallel" arrangement refers to a degree of parallelism sufficient to produce electromagnetic coupling between the bonding wires 4 and 5. The parallelism between the bonding wires 4 and 5 does not need to be of geometrical precision.

As previously described, a significant improvement in the amplification characteristics of the transistor 2 can be obtained by reducing the inductance component residing, in particular, in the ground line 5 which extends from the emitter (or the source) of the transistor 2.

Figure 6:
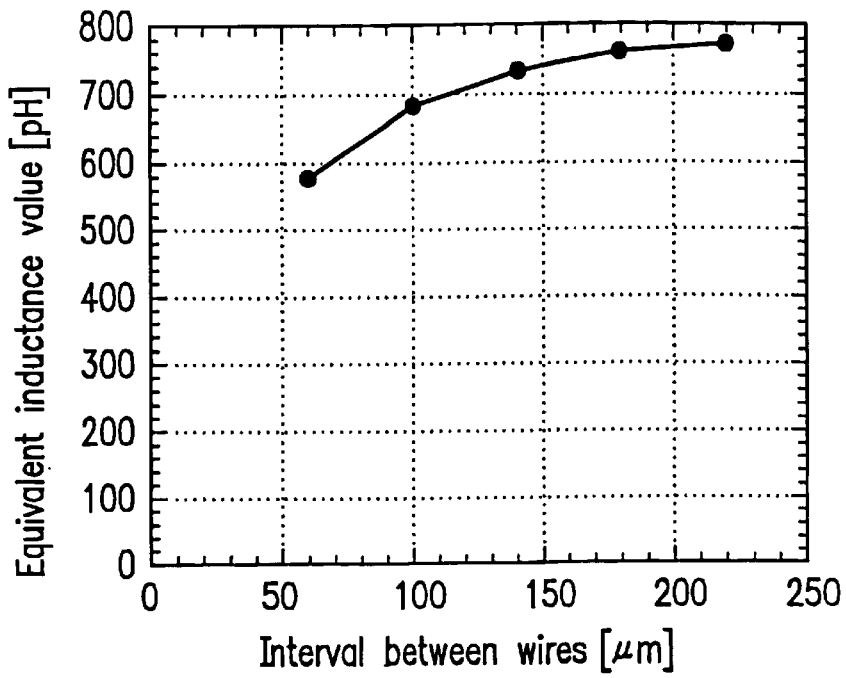
FIG. 6 is a graph illustrating a relationship between an equivalent inductance value obtained when applying currents to two wires (length: about 1 mm) such that there is a phase difference of about 180° between the two currents, and a distance between the respective conductor centers of the two wires.

FIG. 6 is a graph illustrating a relationship between an equivalent inductance value obtained when applying currents to two wires (length: about 1 mm) such that there is a phase difference of about 180° between the two currents, and an interval distance between the respective conductor centers of the two wires. The results shown in FIG. 6 are obtained from an electromagnetic field simulation employing bonding wires (corresponding to the signal line 4 and the ground line 5) made of gold (Au) with a diameter of about 25 $\mu$m.

It can be seen in FIG. 6 that the equivalent inductance value is reduced as the interval between the ground line 5 and the corresponding signal line 4 decreases.

In view of the actual wire diameter which is likely to be used and the possible limitations imposed by bonding machine performance, the above simulation was conducted only down to about a 60 $\mu$m interval between the respective conductor centers of the two wires.

Figure 7:
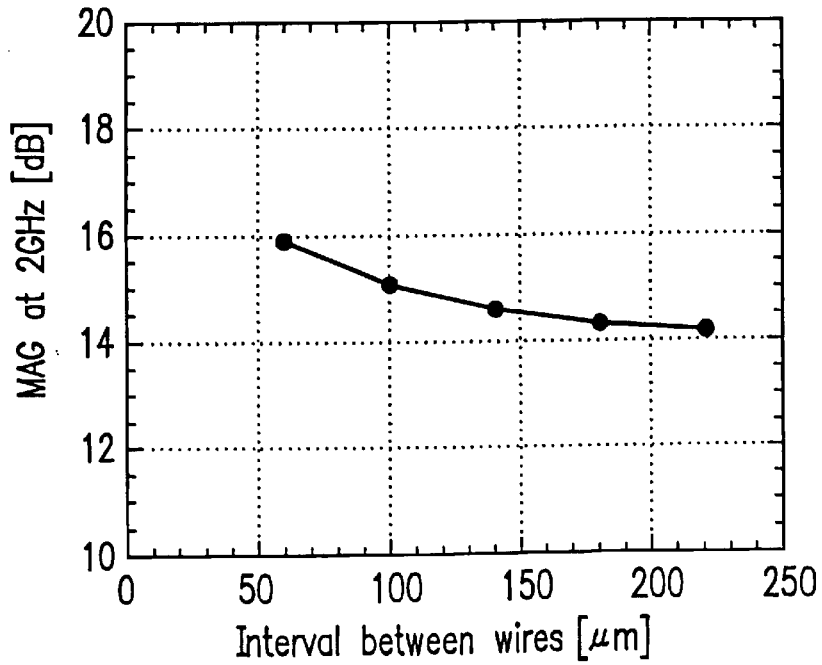
FIG. 7 is a graph illustrating a MAG of an amplification circuit incorporating the output stage transistor in FIG. 1, where the results of the graph in FIG. 6 are applied to the signal line and the ground line extending from the collector and the emitter, respectively, of the output stage transistor.

FIG. 7 is a graph illustrating the results of a simulation for an amplification circuit incorporating the output stage transistor 2 (shown in FIG. 1), where the results of the electromagnetic field simulation (shown in FIG. 6) are applied to the signal line 4 and the ground line 5 extending from the collector and the emitter, respectively, of the output stage transistor 2. The simulation was conducted in order to determine a MAG (Maximum Available Gain) at an operating frequency of about 2 GHz.

As seen from the results of the above simulation, as the interval between the ground line 5 and the corresponding signal line 4 decreases, the equivalent inductance value is reduced and the gain of the amplification circuit is increased (note that only the output stage transistor 2 is illustrated in FIG. 1).

Figure 5:
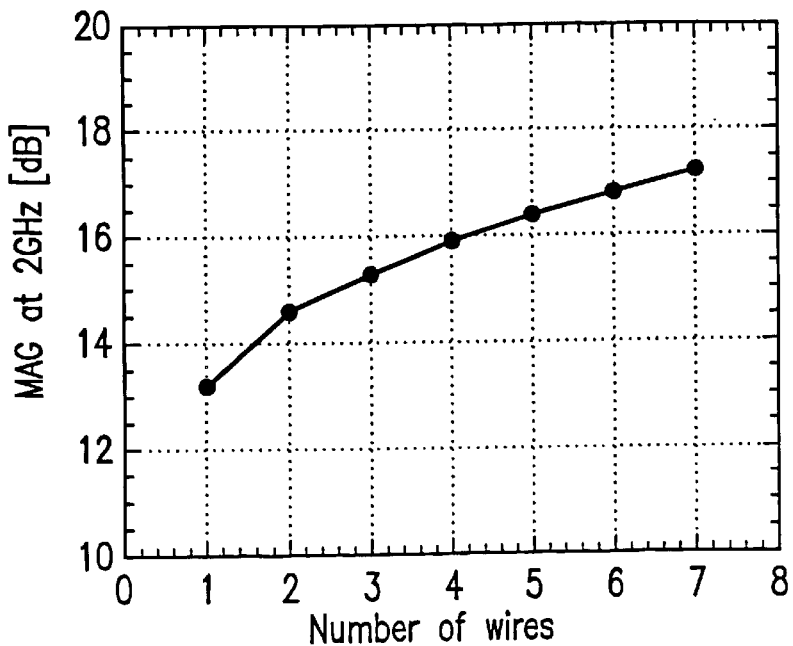
FIG. 5 is a graph illustrating a MAG of an amplification circuit incorporating an output stage transistor, where the results of the graph in FIG. 4 are applied to the ground line extending from the emitter of the output stage transistor.

Thus, the bonding wires (i.e., the signal line 4 and the ground line 5) of the present example are arranged adjacent to each other, down to about a 60 $\mu$m interval, so that the amplification circuit incorporating such bonding wires attains a gain which is equivalent to a gain attained by the conventional example where four bonding wires are used for grounding (see the graph of FIG. 5).

It can also be seen that the present invention is suitable for high density packaging since the effect of the invention increases as the interval between and the ground line 5 and the corresponding signal line 4 decreases.

EXAMPLE 2

Figure 2:
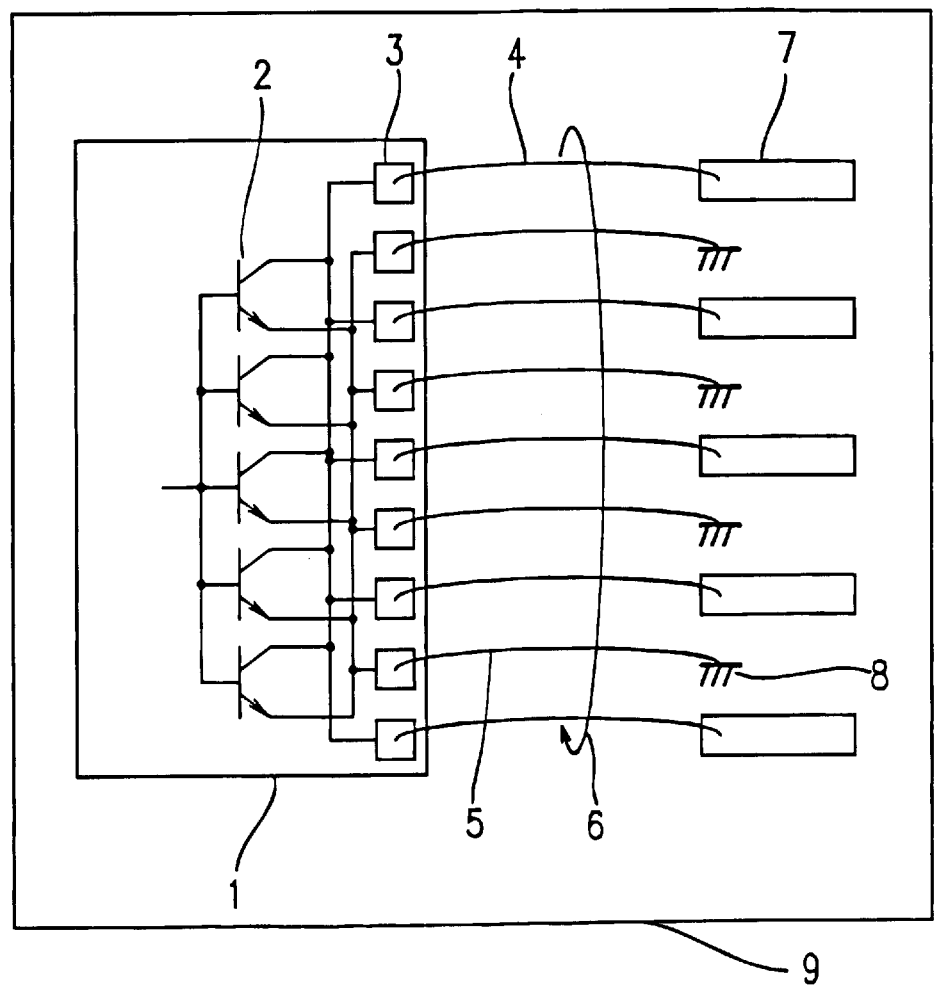
FIG. 2 is a schematic diagram illustrating a RF semiconductor apparatus according to Example 2 of the present invention.

FIG. 2 is a schematic diagram illustrating a RF semiconductor device according to Example 2 of the present invention.

A RF power amplifier for use in mobile communications devices or the like typically incorporates large-size transistors as output stage transistors for better driving capability. Moreover, a multitransistor unit as shown in FIG. 2 is generally used. The present example illustrates a case where the multitransistor unit shown in FIG. 2 (illustrated as including five transistors) is employed as an output stage transistor.

For a single multitransistor unit, a plurality of bonding wires are provided for connection to the collectors (or drains) and emitters (or sources) of the output stage transistor.

In FIG. 2, reference numeral 1 denotes an IC chip (e.g., GaAs); 2 denotes the output stage transistor (composed of five transistors) in the IC chip; 3 denotes a bonding pad, 4 denotes a signal line (bonding wire), 5 denotes a ground line (bonding wire); 7 denotes a lead frame pin for the signal line; 8 denotes a grounding point; and 9 denotes a substrate. The direction of the electromagnetic coupling between the signal line 4 and the ground line 5 is indicated by arrow 6. The grounding point 8 is typically a metal portion (usually referred to as "slug") exposed on a back face of a package, or a grounding lead frame pin may be used as previously described.

All of the collectors of the five transistors within the output stage transistor 2 are integrated by internal lead wires into one common line; the same is true of all of the emitters of the five transistors within the output stage transistor 2. The bounding pads 3 are provided adjacent to the individual transistors, so that the collectors (or the drains) and emitters (or the sources) of the transistors are connected to the signal lines 4 and ground lines 5, respectively, through the bonding pads 3. The signal lines 4 and ground lines 5 are alternately arranged.

Due to the alternating and adjacent arrangement of the signal lines 4 and ground lines 5, the equivalent inductance value of the signal lines 4 and ground lines 5 can be reduced in the same manner as in Example 1.

In the present example, it is assumed that the respective bonding wires (corresponding to the signal lines 4 and the ground lines 5) are made of gold (Au). They are assumed to have a length of about 1 mm and a diameter of about 25 $\mu$m. Five signal lines 4 are provided, whereas four ground lines 5 are provided. The signal lines 4 and the ground lines 5 are alternately arranged at an interval of about 140 $\mu$m between the respective lines. Hereinafter, the arrangement according to this example of the present invention will be referred to as an "alternate arrangement".

Figure 3:
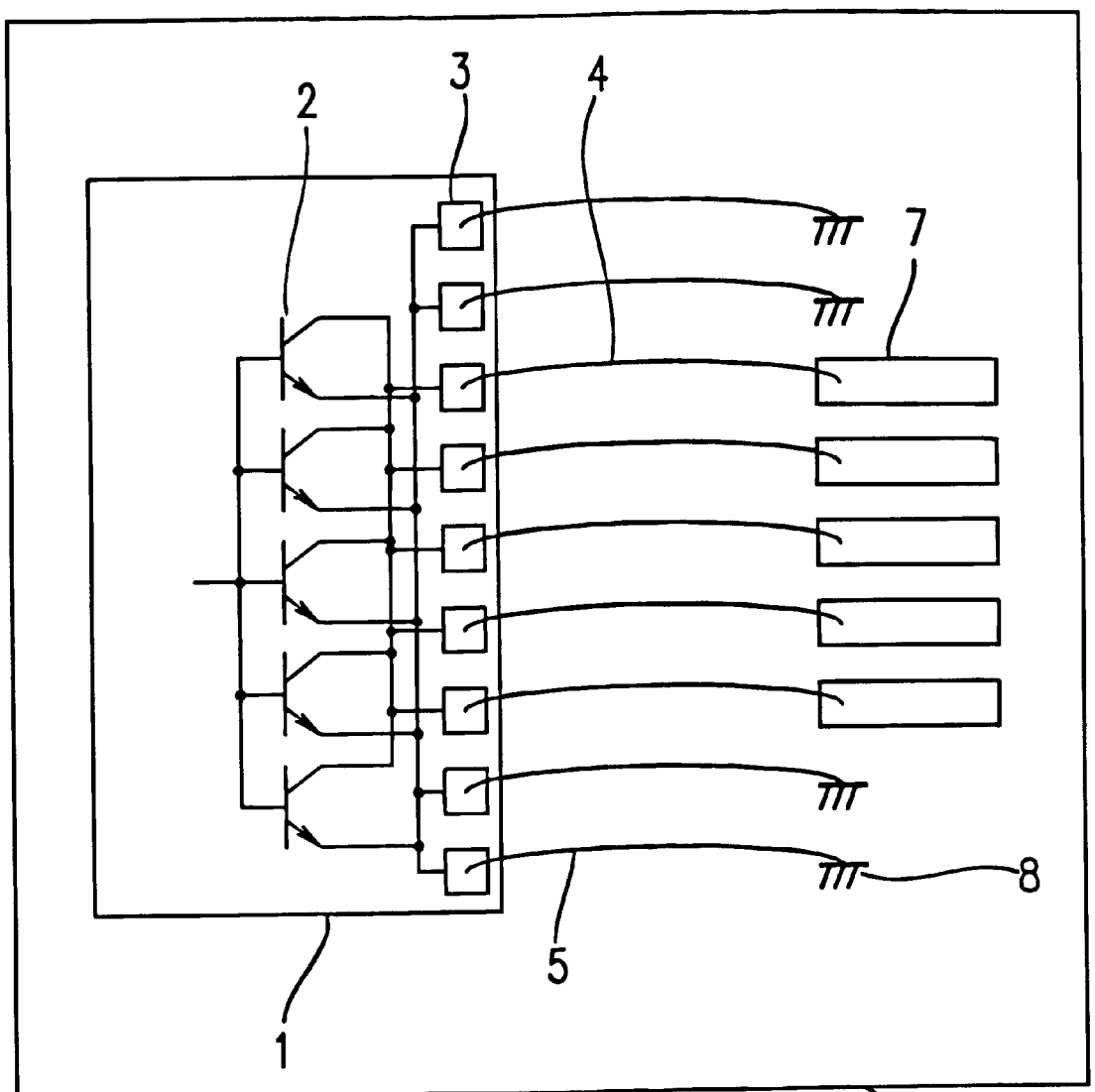
FIG. 3 is a schematic diagram illustrating a conventional RF semiconductor apparatus.
Figure 4:
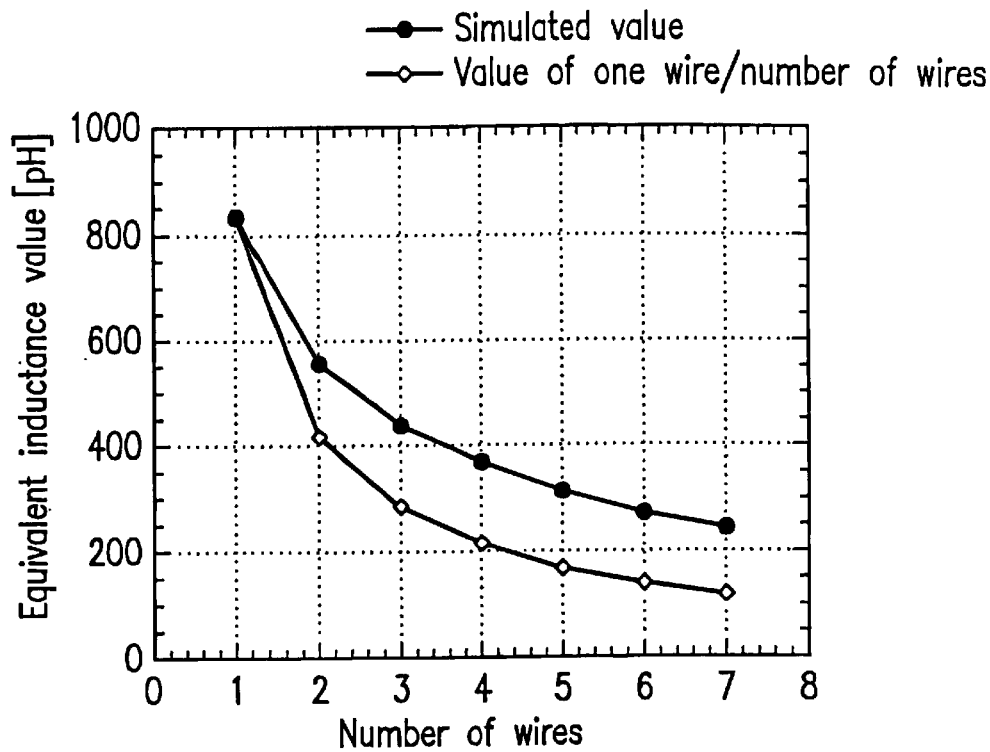
FIG. 4 is a graph illustrating the relationship between the number of bonding wires (length: about 1 mm) which are arranged in a parallel connection at an interval of about 140 $\mu$m and the equivalent inductance value thereof as estimated by an electromagnetic field simulation; illustrated for comparison are the inductance values obtained by dividing the simulated result for one wire by different numbers of wires.

FIG. 3 shows a conventional arrangement which is identical to the arrangement according to the present example of the invention except for the arrangement of the signal lines 4 and the ground lines 5. In the conventional arrangement, the signal lines 4 and the ground lines 5 are arranged separately; such an arrangement will be referred to as a "separate arrangement" hereafter.

Figure 8:
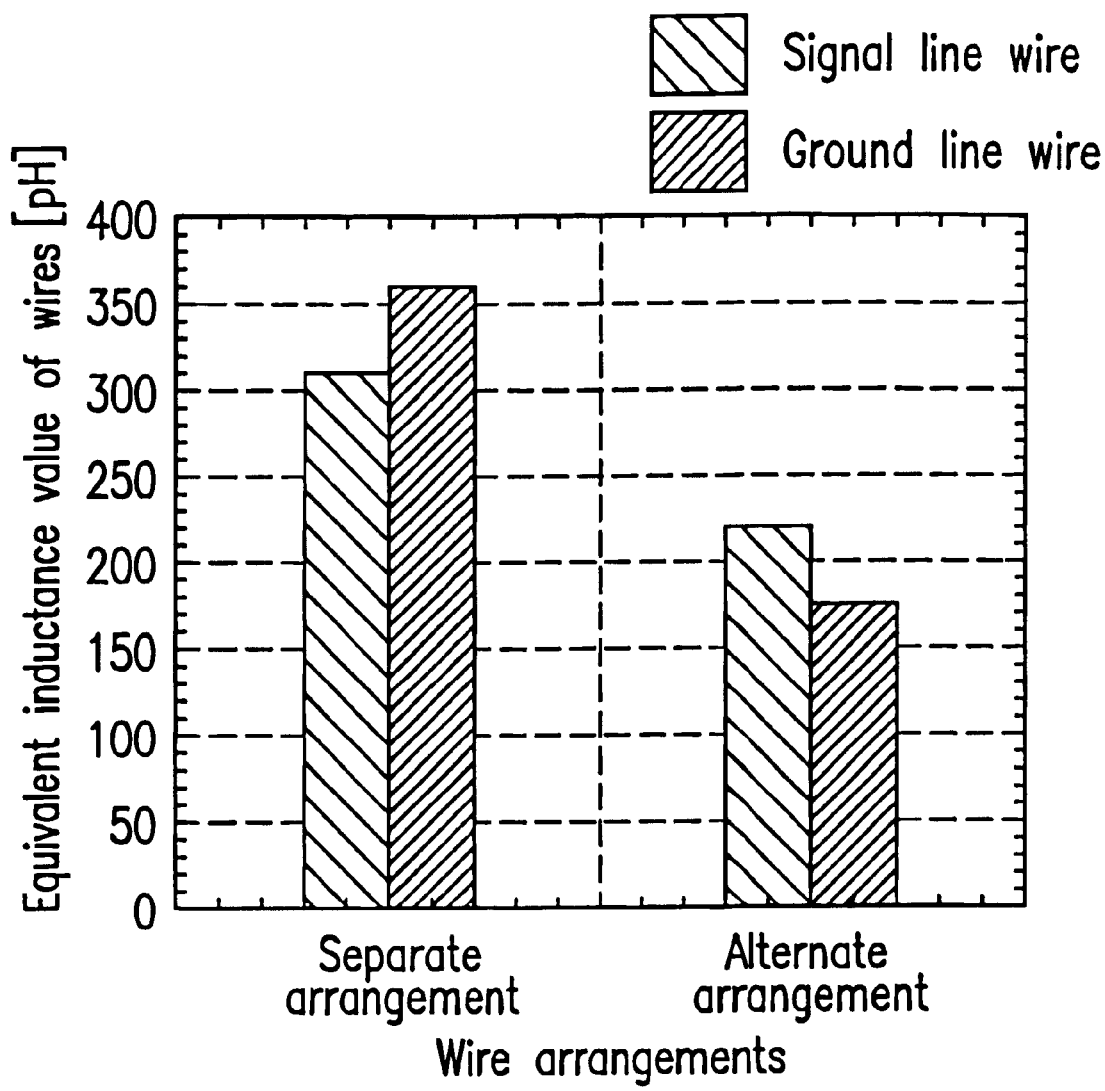
FIG. 8 is a graph illustrating simulated equivalent inductance values of signal lines and ground lines, with respect to the alternate arrangement shown in FIG. 2 and the conventional separate arrangement in FIG. 3, respectively.

FIG. 8 is a graph illustrating the results of simulations for the alternate arrangement according to the present example of the invention and the conventional separate arrangement. The equivalent inductance values of the signal lines 4 and ground lines 5 for the respective arrangements were obtained by electromagnetic field simulations.

As seen from FIG. 8, the equivalent inductance value of the bonding wires corresponding to the ground lines 5, whose inductance is more difficult to reduce and therefore more important to reduce than that of the signal lines 4, is reduced in the alternate arrangement according to this example to about half of that of the conventional separate arrangement.

Figure 9:
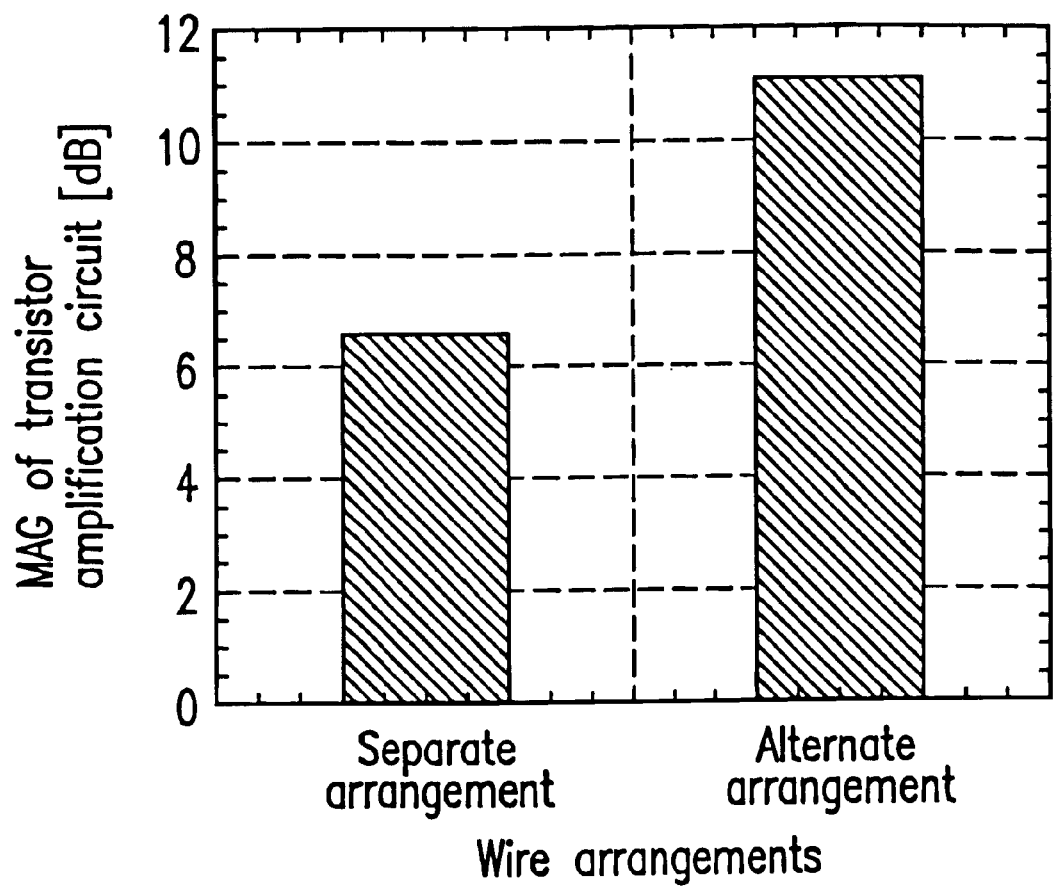
FIG. 9 is a graph illustrating a simulated MAG of an amplification circuit incorporating an output stage transistor, where the equivalent inductance values from the graph of FIG. 8 are applied to the signal line and the ground line extended from the collector and the emitter, respectively, of the output stage transistor, with respect to the alternate arrangement shown in FIG. 1 and the conventional separate arrangement shown in FIG. 3.

FIG. 9 is a graph illustrating the results of a simulation, with respect to the alternate arrangement according to this example and the conventional separate arrangement, for an amplification circuit incorporating the output stage transistor 2, where the results of the electromagnetic field simulation (shown in FIG. 8) are applied to the signal lines 4 and the ground lines 5 extended from the collectors and the emitters, respectively, of the output stage transistor 2. The simulation was conducted in order to determine a MAG at an operating frequency of about 2 GHz in the same manner as described before.

It can be seen from FIG. 9 that the alternate arrangement according to the present example of the invention provides a gain which is about 4 dB higher (approximately 2.5 times more power) than that of the conventional separate arrangement. (It is noted that the absolute values of the gain illustrated in the graph of FIG. 9 appear smaller than those illustrated in the simulations for FIGS. 5 and 7 because the unit size of the transistor employed in the simulation of FIG. 9 was larger than the unit size of the transistor used in the simulations of FIGS. 5 and 7.

Examples described herein are directed to output stage transistors. However, as long as there is a signal line and a corresponding ground line that extend from an IC chip, the effects of the present invention can be obtained by similarly arranging the signal line and the ground line substantially in parallel and adjacent to each other.

Although Example 2 illustrates an alternating arrangement for ground lines and signal lines which are substantially in parallel and adjacent to each other, the ground lines and the signal lines may also be arranged in the following order, for example: ground line-signal line-signal line-ground line-and so on. It has been found by the inventors of the present application that such an arrangement can also reduce the equivalent inductance value of the ground lines as compared with the conventional separate arrangement.

The examples given herein each illustrate a RF semiconductor circuit chip which is mounted face-up and electrically connected to terminals of a package or a substrate by wire bonding. However, even in the case where the RF semiconductor circuit chip is mounted face-down in a package by forming bumps on the terminals thereof, it is possible to reduce the equivalent inductance value of the ground lines by arranging the ground lines and the corresponding signal lines substantially in parallel and adjacent to each other.

Hereinbelow, a case where the RF semiconductor apparatus of the present invention shown in FIGS. 1 and 2 is packaged will be described.

Figure 10:
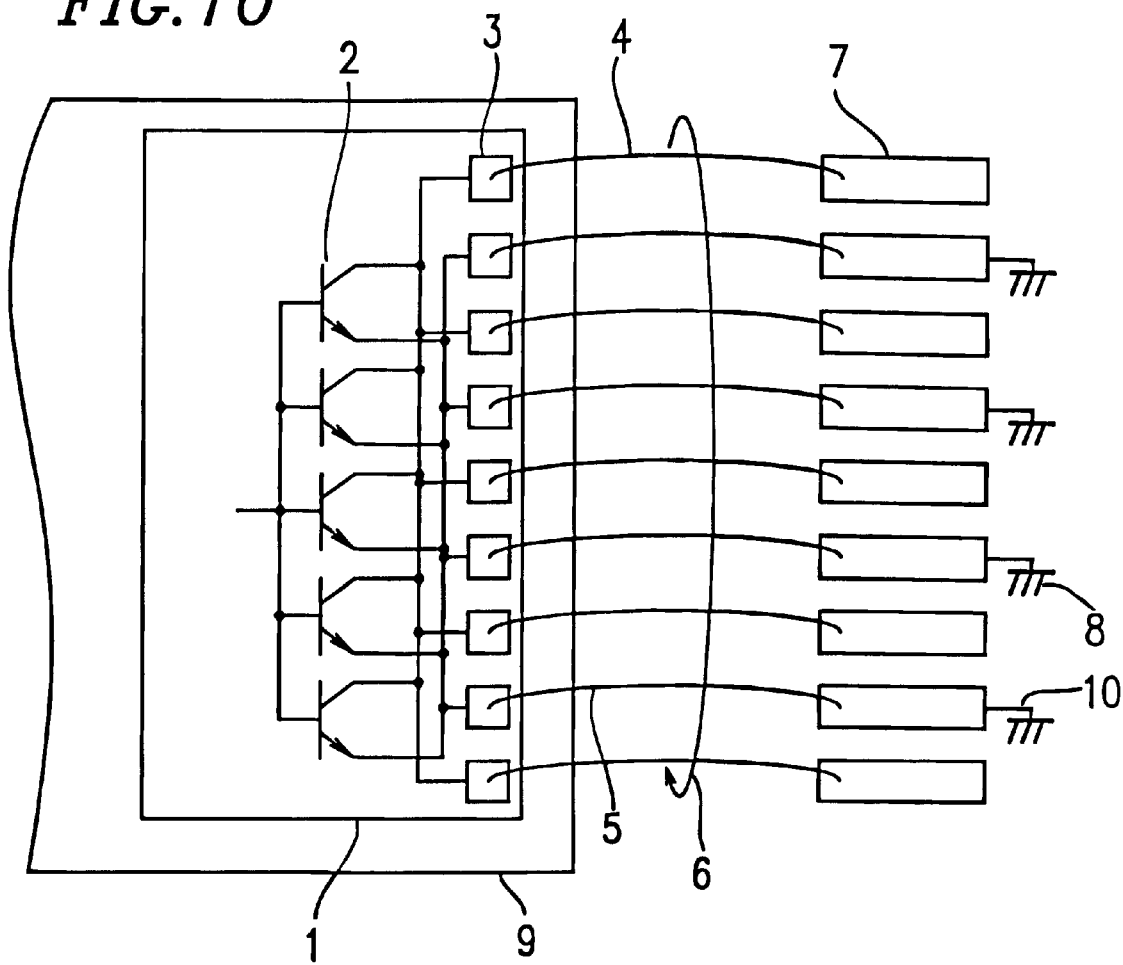
FIG. 10 is a schematic diagram illustrating a packaged radio frequency (RF) semiconductor apparatus.
Figure 11:
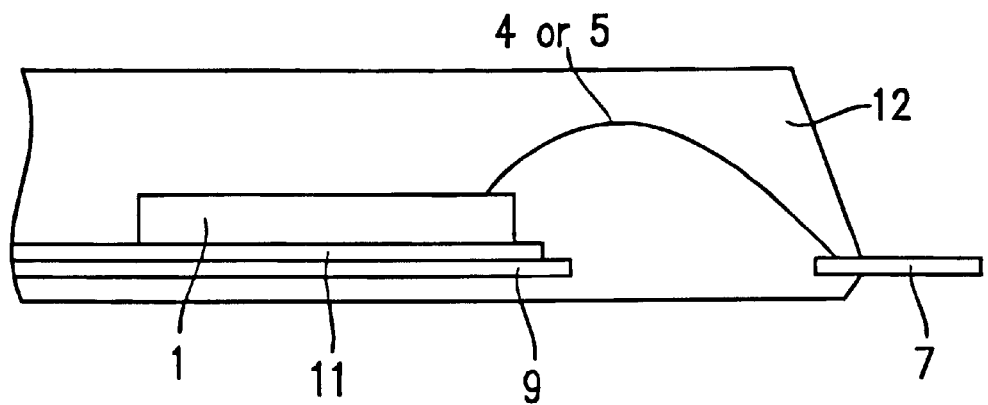
FIG. 11 is a cross-sectional view of the packaged radio frequency (RF) semiconductor apparatus of FIG. 10.

FIG. 10 is a schematic diagram illustrating a packaged RF semiconductor apparatus, and FIG. 11 is a cross-sectional view illustrating the packaged RF semiconductor apparatus of FIG. 10. Only one side of an IC chip is shown in FIGS. 10 and 11 for the purpose of discussion. However, the IC chip will be wire-bonded on two opposite sides or all of the four sides of the IC chip in practice.

Both of a substrate 9 and each lead frame pin 7 are formed using processing techniques such as chemical etching and press punching with a flat plate made of e.g., an Fe—Ni alloy metal. The IC chip 1 is mounted on the substrate 9 via a die bond material 11. Materials such as silver paste and solder may be used as the die bond material 11. Each bonding pad 3 is electrically connected to a corresponding lead frame pin 7 by either a signal line 4 or a grounding line 5. The substrate 9, the IC chip 1 and a portion of each lead frame pin 7 are sealed within a resin 12 (e.g., an epoxy resin), thereby packaging the RF semiconductor apparatus. The lead frame pins 7 extend from the resin 12. Every other lead frame pin 7 (which is used for grounding) is provided with an external wire 10 for grounding. The back face of the substrate 9 does not need to be molded within the resin 12. Instead, a metal portion may be provided on the back face of the substrate 9, so that the metal portion may be used for radiating heat or as a terminal for grounding.

In the above configuration, the ground lines extend outside of the resin 12 via the lead frames 7 so as to be grounded via the external wires 10, respectively. Alternatively, an extension of the substrate 9 sealed within the resin 12 may be utilized as a grounding lead frame for wire-bonding. In that case, it is not necessary to extend external wires 10 from lead frame pins 7 to ground points 8 as illustrated in FIG. 10. Therefore, the external connection terminals (lead frame pins 7) for grounding purpose can be eliminated so that the number of the lead frame pins 7 can be reduced. The back face of the substrate 9 does not need to be molded within the resin 12. Instead, a metal portion may be provided on the back face of the substrate 9, so that the metal portion may be used for radiating heat or as a terminal for grounding.

Although a case has been described where the IC chip 1 is die-bonded, face-up, on the substrate 9 to which the signal lines 4 are wire-bonded, the IC chip 1 may be die-bonded face-down. In this case, bumps may be formed so as to serve as terminals, and the IC chip 1 may be mounted on the lead frames by flip-chip bonding.

As described in great detail herein, a ground line and a signal line, having a phase difference of about 180° from each other, are arranged in parallel and adjacent to each other (and/or disposed in an alternating arrangement) so as to utilize the mutual inductance between the signal line and the ground line. As a result, the present invention effectively reduces the equivalent inductance value of, in particular, the ground lines in a RF semiconductor circuit.

According to the present invention, it is not necessary to perform any special process for forming a recess portion for a die bond section so as to shorten the length of the bonding wires, as would be required in one of the aforementioned conventional methods. Thus, the present invention can be achieved with a very low manufacturing cost. It will also be appreciated that employing the conventional method of shortening the length of the bonding wire in conjunction with the present invention would result in further reduction of inductance values.

The output stage transistors used in a power amplifier are typically designed so as to have a low output impedance (which makes for a large current amplitude), so that sufficient output power can be obtained despite the trend for low voltage operation in recent years. The present invention is particularly advantageous in applications such as power amplifiers where a large current amplitude is required, since the effects of mutual inductance become more prominent as the current amplitude increases.

As mobile communications increase in popularity, higher frequencies will be utilized in the various types of mobile devices. In a mobile device operating at very high frequencies (e.g., a GHz band), each RF semiconductor apparatus within the device is required to operate near its performance limit. Thus, it must be possible to draw upon the optimal performance of each semiconductor apparatus from the periphery so as not to compromise the overall performance of the mobile device.

The inductance component of a ground line is one major factor that could lower the performance of a given semiconductor apparatus as a whole. Therefore, the present invention's effect of reducing the inductance component can provide a great advantage at higher frequencies.

Furthermore, it is possible to provide a RF semiconductor apparatus which is easy to handle by sealing and packaging the ground lines and signal lines thereof with a resin. Sealing and packaging the IC chip with a resin is especially useful for reducing the equivalent inductance of the ground lines in the vicinity of the IC chip, where the ground lines closely adjoin the signal lines and therefore will be most susceptible to the magnetic field generated by the adjacent signal lines.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio frequency (RF) semiconductor apparatus, comprising:
 a RF semiconductor circuit chips;
 a substrate on which the RF semiconductor circuit chip is mounted; and
 a plurality of pairs of signal lines and ground lines, each pair comprising a signal line and a corresponding ground line, for connecting the RF semiconductor circuit chip to the substrate, wherein
 the signal line and the ground line are arranged in positions such that the signal line and the ground line of each of said plurality of pairs of signal lines and ground lines are arranged adjacent to each other, are arranged substantially in parallel to each other, and are alternately arranged, so that a magnetic field created by the signal line and a magnetic field created by the ground line substantially cancel each other in each of the plurality of pairs and the mutual inductance between the signal line and the ground line is sufficiently utilized, and wherein all of the signal lines are interconnected with each other and all of the ground lines are interconnected with each other.

2. A RF semiconductor apparatus according to claim 1, wherein a grounding point of the ground line is a metal portion exposed on a package.

3. A RF semiconductor apparatus according to claim 1, wherein the signal line and the ground line of each of said plurality of pairs of signal lines and ground lines are arranged with an interval of about 140 μm between respective conductor centers of the signal line and the ground line.

4. A RF semiconductor apparatus according to claim 1, wherein the signal line and the ground line of each of said plurality of pairs of signal lines and ground lines each have a length of about 1 mm and a diameter of about 25 μm.

5. A RF semiconductor apparatus according to claim 1, wherein the signal line and the ground line of each of said plurality of pairs of signal lines and ground lines comprise gold (Au).

6. A RF semiconductor apparatus according to claim 1, wherein the RF semiconductor circuit chip comprises gallium arsenide (GaAs).

7. A RF semiconductor apparatus according to claim 1, wherein the plurality of pairs are positioned adjacent to each other.

8. A RF semiconductor apparatus according to claim 1, wherein the plurality of pairs are positioned adjacent to each other, and the signal line and the ground line are arranged so as to alternate throughout the plurality of pairs.

9. A RF semiconductor apparatus according to claim 1, wherein the RF semiconductor circuit chip, the signal line and the ground line of each of said plurality of pairs of signal lines and ground lines are placed within a package.

10. A RF semiconductor apparatus according to claim 9, wherein the package comprises a sealing resin.

* * * * *